United States Patent
Shen et al.

(10) Patent No.: US 11,062,931 B2
(45) Date of Patent: *Jul. 13, 2021

(54) SEMICONDUCTOR APPARATUS WITH INNER WAFER CARRIER BUFFER AND METHOD

(71) Applicant: Taiwan Semiconductor Manufacturing Company, Ltd., Hsin-Chu (TW)

(72) Inventors: Jason Shen, Jhubei (TW); Wen-Yu Huang, Zhubei (TW); Li-Jen Ko, Zhubei (TW); Hsiang Yin Shen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 47 days.

This patent is subject to a terminal disclaimer.

(21) Appl. No.: 16/548,449

(22) Filed: Aug. 22, 2019

(65) Prior Publication Data

US 2019/0378736 A1    Dec. 12, 2019

Related U.S. Application Data

(62) Division of application No. 13/623,814, filed on Sep. 20, 2012, now Pat. No. 10,403,532.

(51) Int. Cl.
*H01L 21/677*    (2006.01)
*H01L 21/67*    (2006.01)

(52) U.S. Cl.
CPC .. *H01L 21/67763* (2013.01); *H01L 21/67017* (2013.01); *H01L 21/67028* (2013.01); *H01L 21/67201* (2013.01)

(58) Field of Classification Search
None
See application file for complete search history.

(56) References Cited

U.S. PATENT DOCUMENTS

| 5,121,705 A | 6/1992 | Sugino |
| 5,855,681 A | 1/1999 | Maydan et al. |
| 8,703,614 B2 | 4/2014 | Jin |
| 10,403,532 B2* | 9/2019 | Shen ................ H01L 21/67763 |
| 2003/0009904 A1 | 1/2003 | Tokunaga |
| 2003/0113188 A1 | 6/2003 | Pool |

FOREIGN PATENT DOCUMENTS

| TW | 200741804 | 11/2007 |
| TW | 201027659 | 7/2010 |

* cited by examiner

*Primary Examiner* — Karla A Moore
(74) *Attorney, Agent, or Firm* — Haynes and Boone, LLP

(57) ABSTRACT

The present disclosure provides one embodiment of a semiconductor processing apparatus. The semiconductor processing apparatus includes a load lock designed to receive a wafer carrier; an inner wafer carrier buffer configured to hold the wafer carrier received from the load lock and to perform a nitrogen purge to the wafer carrier; and a processing module designed to perform a semiconductor process to wafers from the wafer.

20 Claims, 6 Drawing Sheets

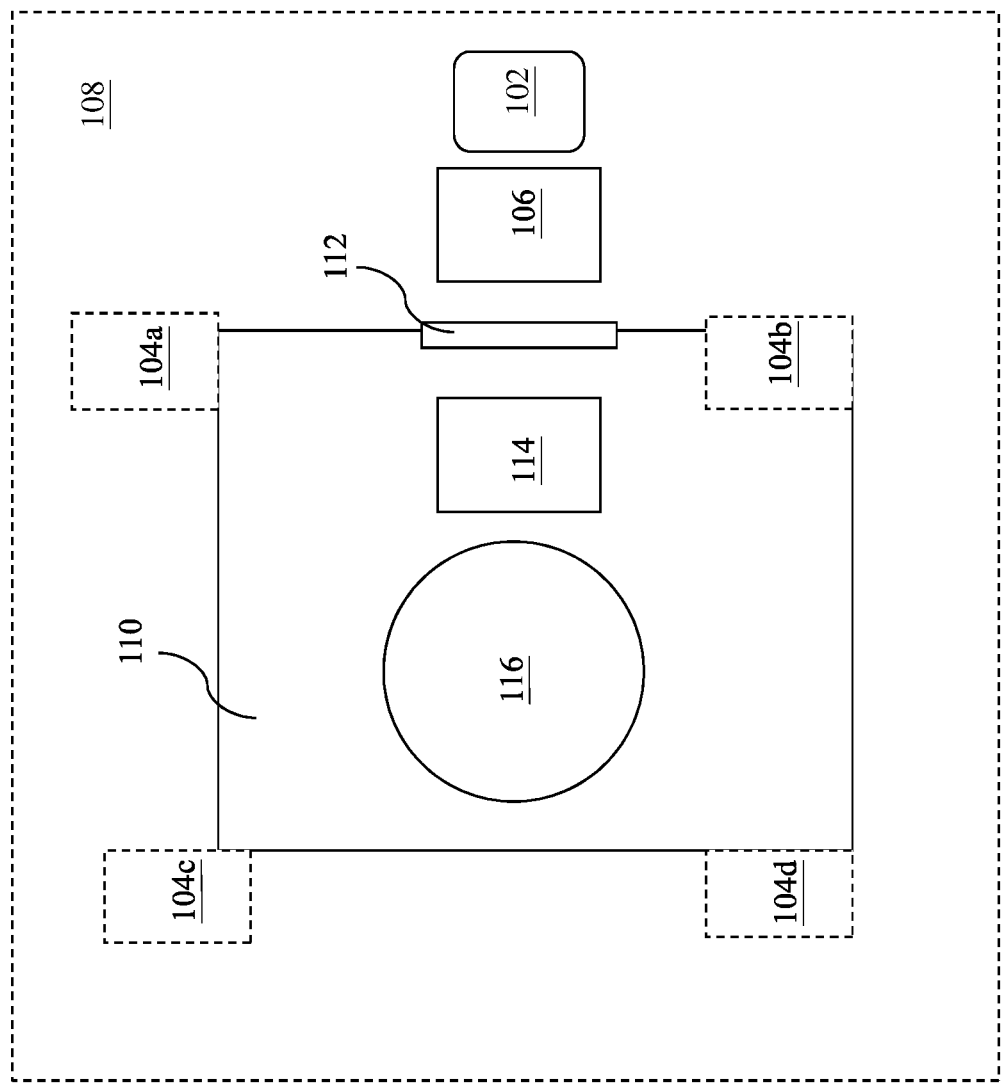

SEMICONDUCTOR APPARATUS WITH INNER WAFER CARRIER BUFFER AND METHOD

CROSS-REFERENCE TO RELATED APPLICATIONS

This is divisional application of and claims priority to U.S. Provisional patent application Ser. No. 13/623,814, now U.S. Pat. No. 10,403,532, filed on Sep. 20, 2012, the entire disclosure of which is incorporated herein by reference.

BACKGROUND

In semiconductor technologies, a semiconductor wafer is processed through various fabrication steps to form integrated circuits defined in multiple chips. Those fabrication steps include lithography patterning, etching, ion implantation, deposition, oxidation and thermal annealing. For example, a thermal oxidation process may be applied to a wafer to form an oxidation layer, such as a silicon oxide layer. In advanced technologies, a furnace tool includes a place to hold a wafer carrier and another place for nitrogen purge before the oxidation. However, the charge process to send wafers to the oxidation boat has quality issues due to Q time concern. Particularly, the nitrogen purge is implemented before wafer charge in the loading area. The wafer charge process is prolonged and the throughput is decreased.

What is needed is a processing apparatus and method to address the above concerns.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

FIG. 6 is a schematic diagram of a processing apparatus integrated with an inner wafer carrier constructed according to aspects of the present disclosure in other embodiments.

DETAILED DESCRIPTION

The present disclosure relates generally to bonding systems and a method of utilizing such systems for wafer bonding. It is understood, however, that the following disclosure provides many different embodiments, or examples, for implementing different features of the invention. Specific examples of components and arrangements are described below to simplify the present disclosure. These are, of course, merely examples and are not intended to be limiting.

Figure 1:
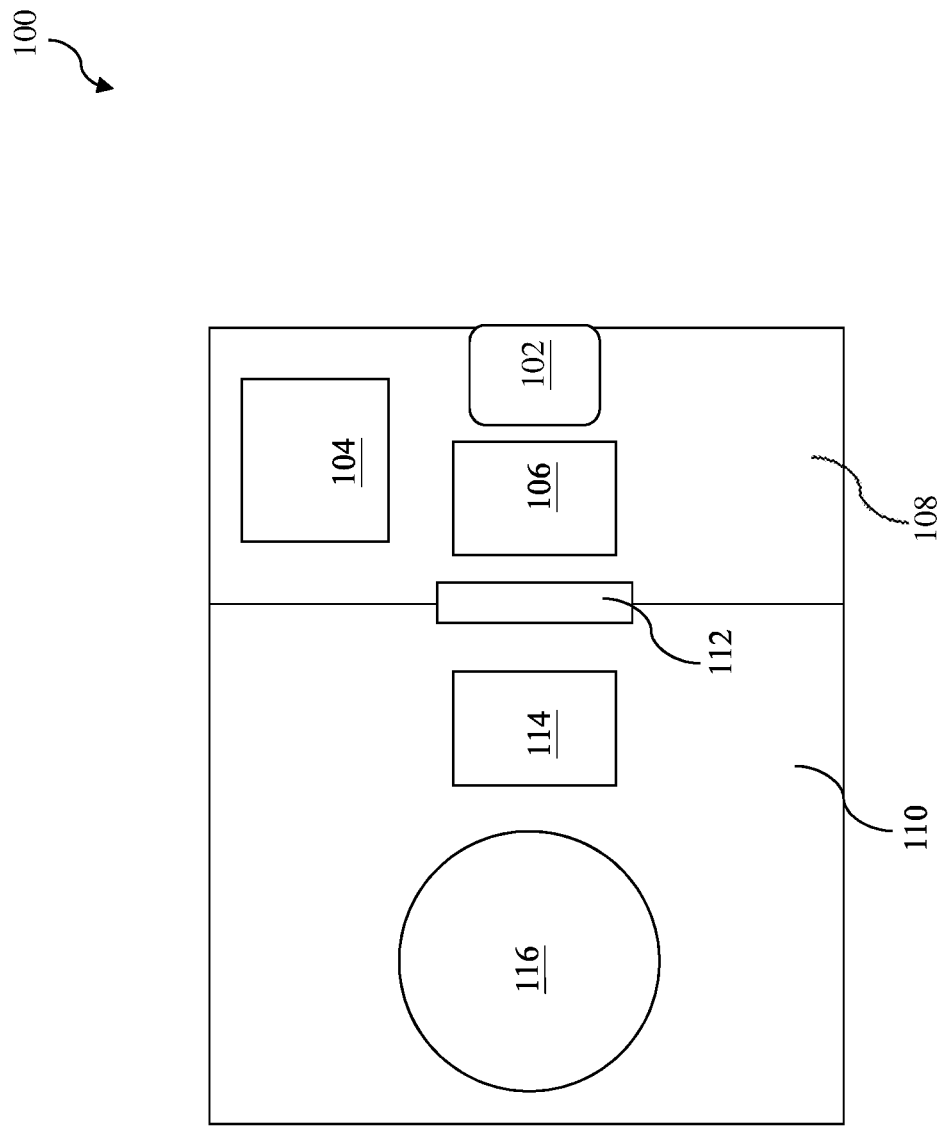
FIG. 1 is a schematic diagram of an embodiment of a processing apparatus integrated with an inner wafer carrier buffer constructed according to aspects of the present disclosure.
Figure 2:
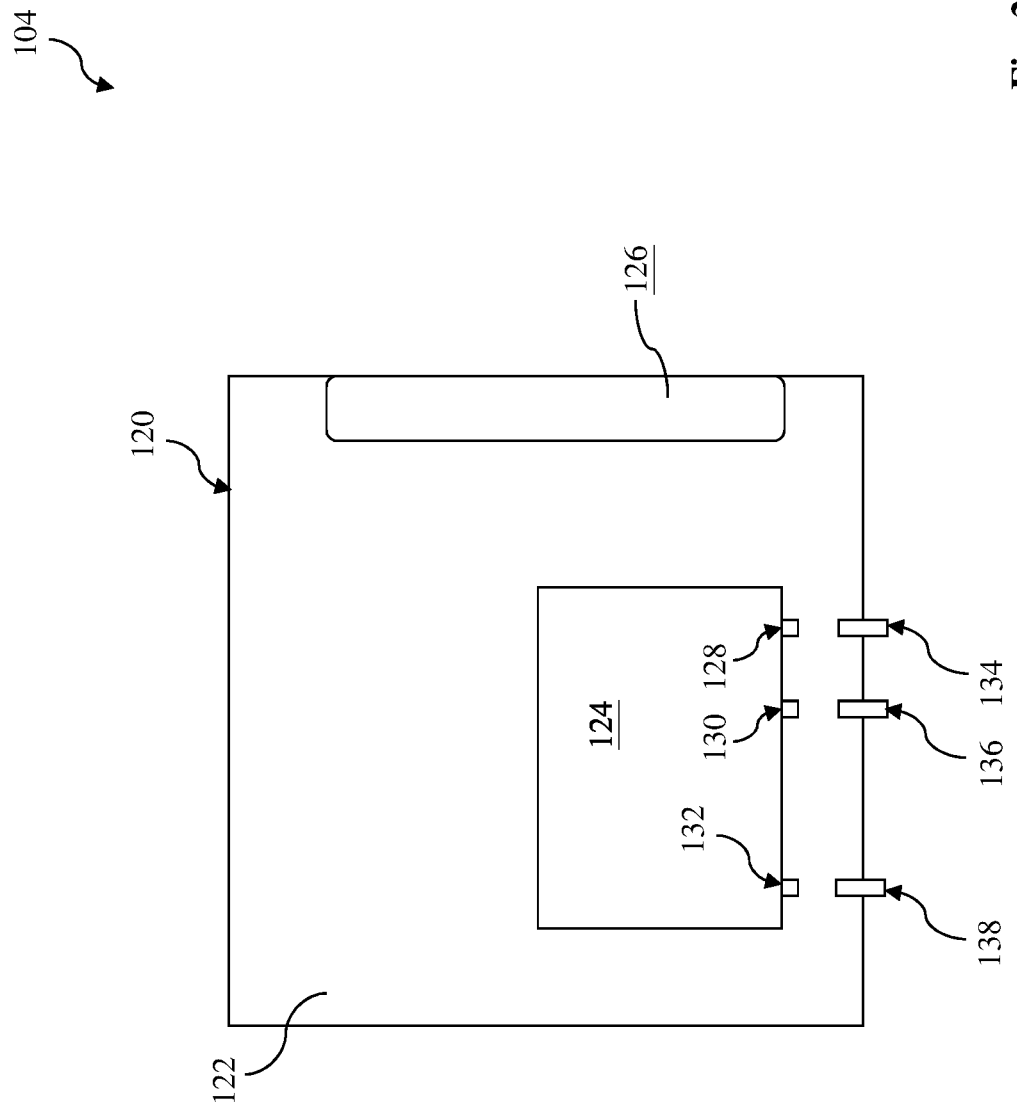
FIG. 2 is a schematic diagram of an embodiment of the inner wafer carrier buffer of FIG. 1 constructed according to aspects of the present disclosure.

Referring to FIG. 1, illustrated is a schematic top view of a processing apparatus 100 integrated with an inner wafer carrier buffer constructed according to aspects of the present disclosure in one embodiment. FIG. 2 is a schematic diagram of an embodiment of the inner wafer carrier buffer of the processing apparatus constructed according to aspects of the present disclosure. The processing apparatus 100 is configured and designed to perform a semiconductor fabrication process (or semiconductor process). In the present embodiment, the processing apparatus 100 is designed for thermal oxidation. In another embodiment, the processing apparatus 100 is designed for thermal annealing. Alternatively or additionally, the processing apparatus 100 may be designed for other process, such as lithography patterning, etching, ion implantation or deposition.

The processing apparatus 100 includes a load lock 102 designed as an apparatus gate to receive a wafer carrier that is able to carry a plurality of wafers. In the present embodiment, the wafer carrier is a front opening unified pod (FOUP). In furtherance of embodiment, the wafers to be contained in the wafer carrier are 300 mm semiconductor wafers or 450 mm semiconductor wafers. In one particular example, the processing apparatus 100 includes two load locks 102 to load wafer carriers in parallel.

The processing apparatus 100 includes an inner wafer carrier buffer (IWCB) 104 designed to hold one or more wafer carriers. In one example, the inner wafer carrier buffer 104 is designed to hold 8 to 10 FOUPs. The inner wafer carrier buffer 104 functions as an inner buffer to store wafer carrier(s) before the fabrication process. A wafer carrier is transferred from the load lock 102 to the inner wafer carrier buffer 104 by an outer transfer unit 106. The outer transfer unit 106 includes a mechanism to secure the wafer carrier and transfer the wafer carrier, such as transferring the wafer carrier between the load lock 102 and the inner wafer carrier buffer 104. In the present example, the outer transfer unit 106 includes a first robot that is operable to hold and move the wafer carrier.

Furthermore, the inner wafer carrier buffer 104 is operable to perform a nitrogen purge process to the wafers in the wafer carrier held therein. The inner wafer carrier buffer 104 is further described with reference to FIG. 2. The inner wafer carrier buffer 104 includes various wall features 120 defining a storage space 122 for holding one or more wafer carriers 124, such as FOUPs. The inner wafer carrier buffer 104 also includes a door 126 that is operable to open and close. The wafer carrier 124 is transferred in to or out from the inner wafer carrier buffer 104 through the door 126.

The wafer carrier (e.g., FOUP) 124 includes various gas ports, such as 128, 130 and 132. In the present embodiment, the gas port 128 is designed as a gas path for providing nitrogen gas to the wafer carrier 124, and the gas port 130 is designed as a gas path for exhausting the nitrogen gas from the wafer carrier 124. In another embodiment, the gas port 132 is designed as a gas path for adjusting the pressure of the wafer carrier 124.

The inner wafer carrier buffer 104 includes various gas transportation mechanisms configured to be connectable to respective gas ports of the wafer carrier 124 (such as gas ports 128, 130 and 132) and designed being operable to perform nitrogen purge to the wafer carrier 124. When the wafer carrier 124 is transferred to the inner wafer carrier buffer 104, it is be positioned such that the various gas transportation mechanisms are coupled with the respective gas ports of the wafer carrier 124. In the present embodiment, the inner wafer carrier buffer 104 includes a gas inlet 134 configured to be connectable to the gas port 128 of the wafer carrier 124. The inner wafer carrier buffer 104 includes a gas outlet 136 configured to be connectable to the gas port 130 of the wafer carrier 124. In furtherance of the present embodiment, the gas inlet 134 is further coupled to a nitrogen source such that the nitrogen gas can be transported to the wafer carrier 124 through the gas inlet 134 of the inner wafer carrier buffer 124 and the gas port 128 of the wafer carrier 124. The gas outlet 136 is further coupled to an exhaust mechanism such that the nitrogen gas can be transported out from the wafer carrier 124 through the gas outlet 136 of the inner wafer carrier buffer 124 and the gas port 130 of the wafer carrier 124. In one embodiment, the gas port 134 includes a valve being controlled for on and off. Similarly, the gas port 136 includes another valve being controlled for on and off.

The inner wafer carrier buffer 104 further includes a pressurization device 138 configured to be connectable to the gas port 132 of the wafer carrier 124. The pressurization device 138 is designed to be operable to adjust the pressure of the wafer carrier. In the present embodiment, the pressurization device 138 includes a valve being controlled for on and off and includes a sensor to monitor the pressure of the wafer carrier 124. In one embodiment where the inner wafer carrier buffer 104 is designed to hold multiple wafer carriers, the inner wafer carrier buffer 104 includes multiple sets of gas transportation mechanisms configured to be connectable to respective wafer carriers.

Referring back to FIG. 1, the processing apparatus 100 includes the inner wafer carrier buffer 104 and the outer transfer unit 106 configured in an enclosed region 108, which is also referred to as buffer module 108. The processing apparatus 100 includes another enclosed region 110 for a fabrication process (such as thermal oxidation or other suitable process), which is also referred to as loading area module 110. The loading area module 110 is adjacent the buffer module 108 and is integrated with the buffer module. Particularly, the loading area module 110 is coupled with the buffer module 108 through a door mechanism (or door) 112 for wafer transferring.

The loading area module 110 includes an inner transfer unit 114 to transfer wafers. The inner transfer unit 114 includes a mechanism to secure and transfer a wafer. In the present example, the inner transfer unit 114 includes a second robot that is operable to hold and move a wafer. When the wafer carrier 124 is transferred to the door 112 from the inner wafer carrier buffer 104 by an outer transfer unit 106, the inner transfer unit 114 transfers wafers from the wafer carrier 124 at the door 112 to the loading area module 110 or transfers the wafers from the loading area module 110 to the wafer carrier 124 at the door 112.

The loading area module 110 includes a processing module 116 to hold wafer(s) and to perform the fabrication process (such as thermal oxidation) to the wafer(s). The processing module 116 may be designed to perform a batch process to a plurality of wafers. In the present embodiment, the processing module 116 is designed to perform a thermal oxidation process to a batch of wafers. In one example, a batch includes a number of wafers ranging between about 50 and about 100 wafers.

The processing module 116 includes a mechanism, such as a wafer boat, to hold one or more wafers. For example, the wafer boat is designed to hold a batch of wafers having about 50 to 100 wafers. In the present embodiment, the processing module 116 includes a mechanism for thermal oxidation. In furtherance of the embodiment, the processing module 116 includes a heating source and oxygen source configured to perform the thermal oxidation. In other embodiment, the processing module 116 may include other proper component, such as a thermal sensor to monitor temperature and may further include a control mechanism to control the thermal oxidation temperature using a proper control mode, such as feedback.

When the wafer carrier 124 and the wafers therein are nitrogen purged at the inner wafer carrier buffer 104, the wafer carrier 124 is transferred to the door 112 by the outer transfer unit 106. The inner transfer unit 114 is used to transfer wafers from the wafer carrier 124 at the door 112 to the processing module 116 (such as the wafer boat) through the door 112. This procedure may be repeated to other wafer carriers in the inner wafer carrier buffer 104 such that the wafers reach the capacity of the processing module 116 for the fabrication process. This procedure is referred to as wafer charge. Since the nitrogen purge is implemented in the inner wafer carrier buffer 104, the wafer charge time is substantially reduced. Thereafter, the fabrication process is applied to the wafers charged in the processing module 116. The fabrication efficiency is substantially increased since the idle time of the processing module 116 is reduced or minimized. The wafers in the processing module 116 are discharged after the respective fabrication process is completed.

Figure 3:
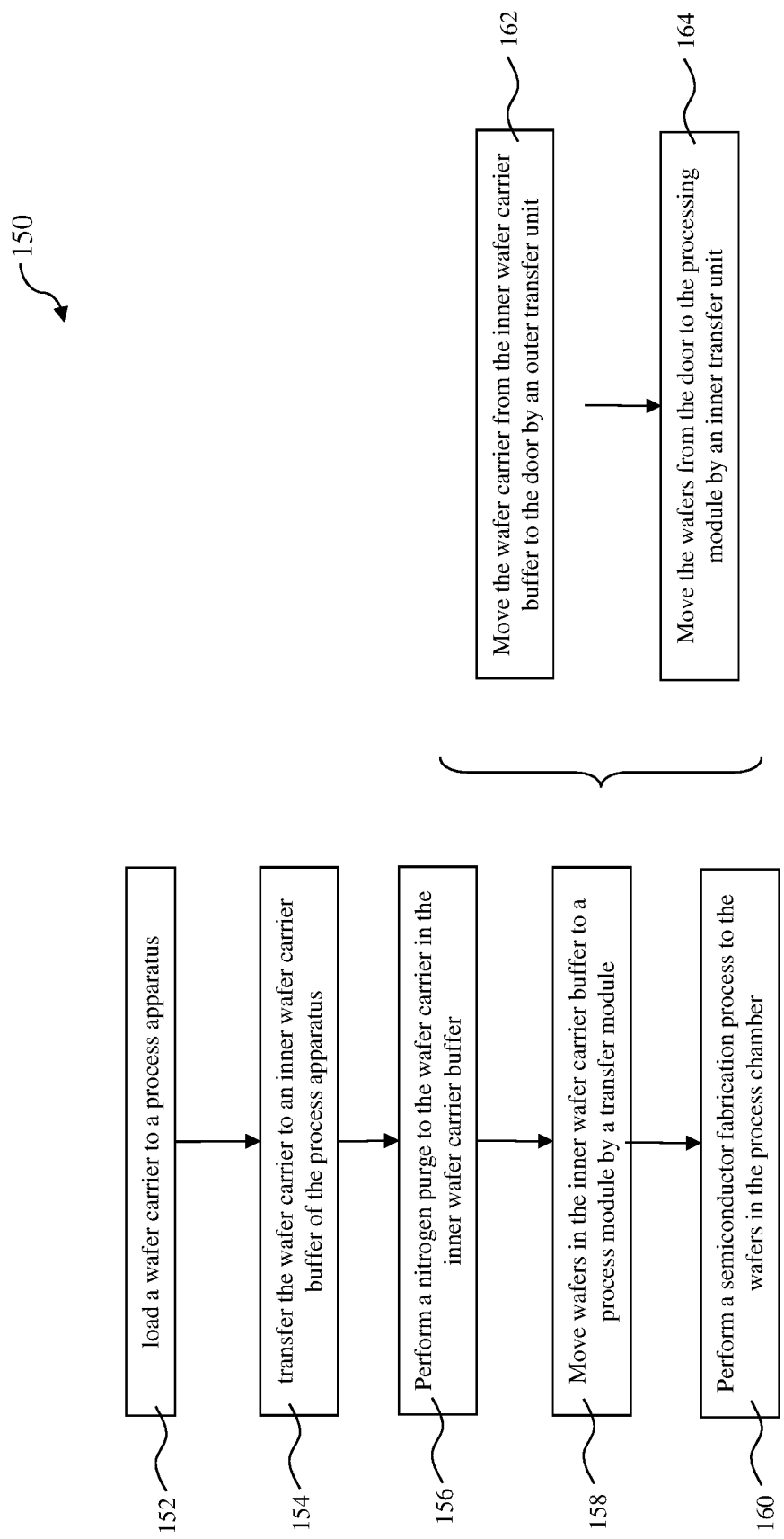
FIG. 3 is a flowchart of one embodiment of a method utilizing the processing apparatus of FIG. 1 constructed according to aspects of the present disclosure.

FIG. 3 is a flowchart of a method 150 to perform a fabrication process (such as thermal oxidation) constructed according to aspects of the present disclosure in one or more embodiment. The method 150 is implemented in the processing apparatus 110 in the present embodiment. The method 150 is described with reference to FIGS. 1 to 3. The method includes an operation 152 by loading a wafer carrier 124 to the processing apparatus 100 through the load lock 102. In one embodiment, two or more wafer carriers are loaded into the processing apparatus 100. In another embodiment, the processing apparatus 100 includes two or more load locks 102 to load the multiple wafer carriers.

The method 150 also includes an operation 154 by transferring the wafer carrier 124 from the load lock 102 to the inner wafer carrier buffer 104 by the outer transfer unit 106. When the wafer carrier 124 is transferred to the inner wafer carrier buffer 104, the wafer carrier is positioned such that its gas ports are connected to the respective gas transportation mechanisms of the inner wafer carrier buffer 104. In one embodiment, the multiple wafer carriers are transferred to the inner wafer carrier buffer 104 by the outer transfer unit 106 in a proper mode, such as one carrier by one carrier.

The method 150 also includes an operation 156 by performing a nitrogen purge to the wafer carrier(s) 124 in the inner wafer carrier buffer 104. The nitrogen purge is implemented by controlling the gas transportation mechanisms (such as the gas inlet 134 and the gas outlet 136) of the inner wafer(s) carrier buffer 104. In one embodiment, the pressurization device 138 is further controlled to adjust the pressure of the wafer carrier(s) 124 for a proper carrier pressure during the storage and/or the nitrogen purge of the wafer carrier(s) 124.

The method 150 also includes an operation 158 by moving the wafers in the inner wafer carrier buffer 104 to the processing module 116 using a transfer module. The wafer transfer is implemented after the nitrogen purge. In the present embodiment, the transfer module includes an outer transfer unit 106 for wafer carrier transferring and the inner transfer unit 114 for wafer transferring. In furtherance of the embodiment, the operation 158 includes two steps for wafer carrier transferring and wafer transferring, respectively. Particularly, the operation 158 includes a first step 162 for wafer carrier transferring. At step 162, the outer transfer unit 106 is employed to transfer the wafer carrier 124 to the door 112. The operation 158 includes a second step 164 for wafer transferring after the first step. At step 164, the inner transfer unit 114 is used to transfer wafers from the wafer carrier 124 at the door 112 to the processing module 116 (such as the wafer boat) through the door 112. Afterward, the empty wafer carrier 124 at the door 112 is moved back to the inner wafer carrier buffer 104 by the outer transfer unit 106. This procedure may be repeated to other wafer carriers in the inner wafer carrier buffer 104. The thus transferred wafers may reach the maximum capacity of the processing module 116 for the fabrication process. As noted, this procedure is referred to as wafer charge. Since the nitrogen purge is implemented in the inner wafer carrier buffer 104, the wafer charge time is substantially reduced. The stay time of the wafer carrier 124 at the door 112 is reduced to the time enough to transfer the wafers in the wafer carrier to the processing module 116.

Thereafter, the method 150 includes an operation 160 by perform a semiconductor fabrication process (or semiconductor process) to the wafers in the processing module 116. In the present example, the semiconductor process includes thermal oxidation. It is a batch process applied to the wafers in the processing module 116. In this particular example, the wafers are positioned in a wafer boat designed to hold a plurality of wafers. In one example, the batch of wafers in the wafer boat includes about 50 to 100 wafers. In other examples, the semiconductor process may include thermal annealing or other suitable process, such as other suitable batch process. The fabrication efficiency is substantially increased since the idle time of the processing module 116 is reduced or minimized.

Other operations may be implemented before, during or after the method 150. In one embodiment, the wafers in the processing module 116 are discharged after the respective fabrication process at the operation 160 is completed. In furtherance of the embodiment, the discharge may include transferring the wafers from the processing module 116 to the wafer carrier at the door 112 by the inner transfer unit 116 and thereafter transferring the wafer carrier from the door 112 to the inner wafer carrier buffer 104 by the outer transfer unit 106. In another embodiment, the wafer carrier may be directly sent out of the processing apparatus 100 through the load lock 102. In another alternative embodiment, after the all wafers in the processing module 116 are transferred to the inner wafer carrier buffer 104 with respective wafer carriers, those wafer carriers are then transferred out of the processing apparatus 100 through the load lock 102.

Figure 4:
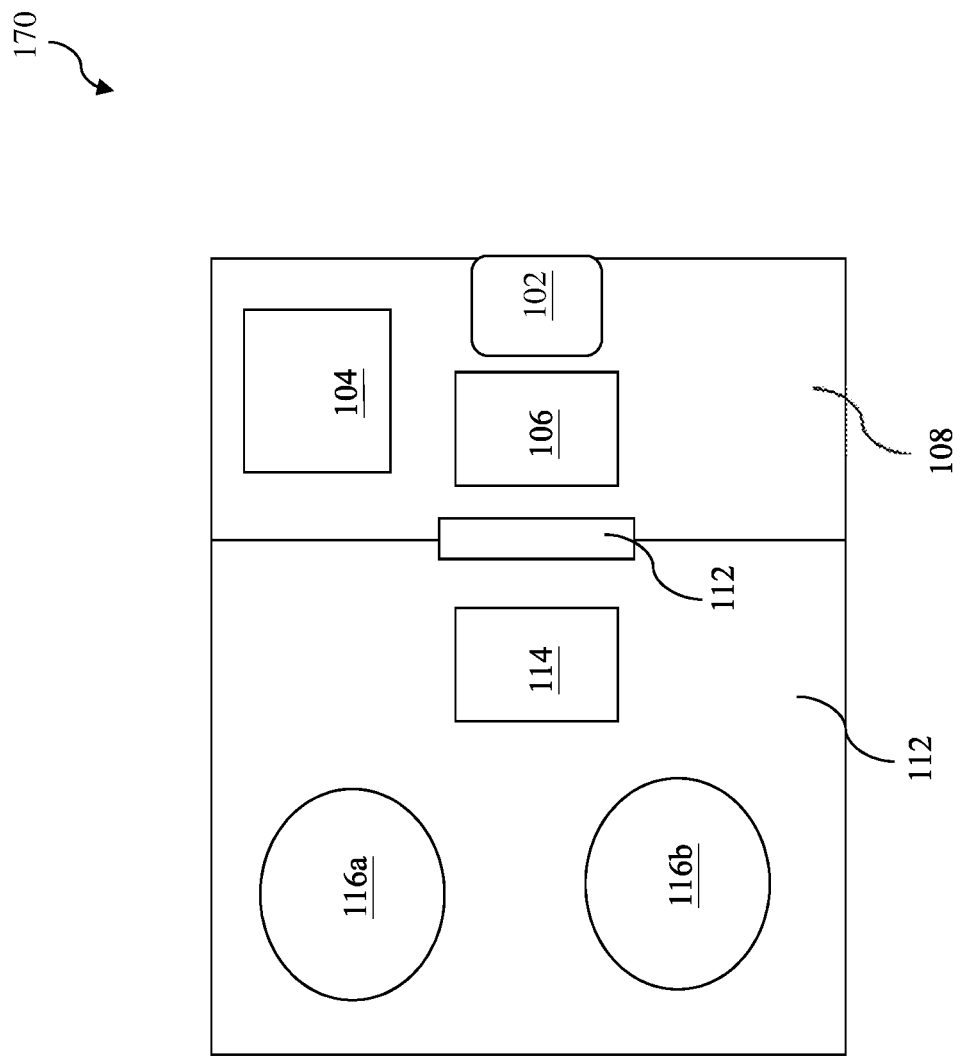
FIG. 4 is a schematic diagram of another embodiment of a processing apparatus integrated with an inner wafer carrier constructed according to aspects of the present disclosure.

FIG. 4 illustrates a schematic top view of a processing apparatus 170 constructed according to aspects of the present disclosure in another embodiment. The method 150 may be implemented in the processing apparatus 170 according to one embodiment. The processing apparatus 170 is similar to the processing apparatus 100. However, in the processing apparatus 170, the loading area module 110 includes two or more processing modules, such as processing modules 116*a* and 116*b* for example. The multiple processing modules are configured in the loading area module 112. Accordingly, the wafer charge process is implemented such that wafers are transferred to the multiple processing modules. In another example of the wafer charge process, the wafers may be alternatively transferred to a first processing module for a first fabrication process. Then the wafers are transferred from the first processing module to a second processing module for a second fabrication process.

Figure 5:
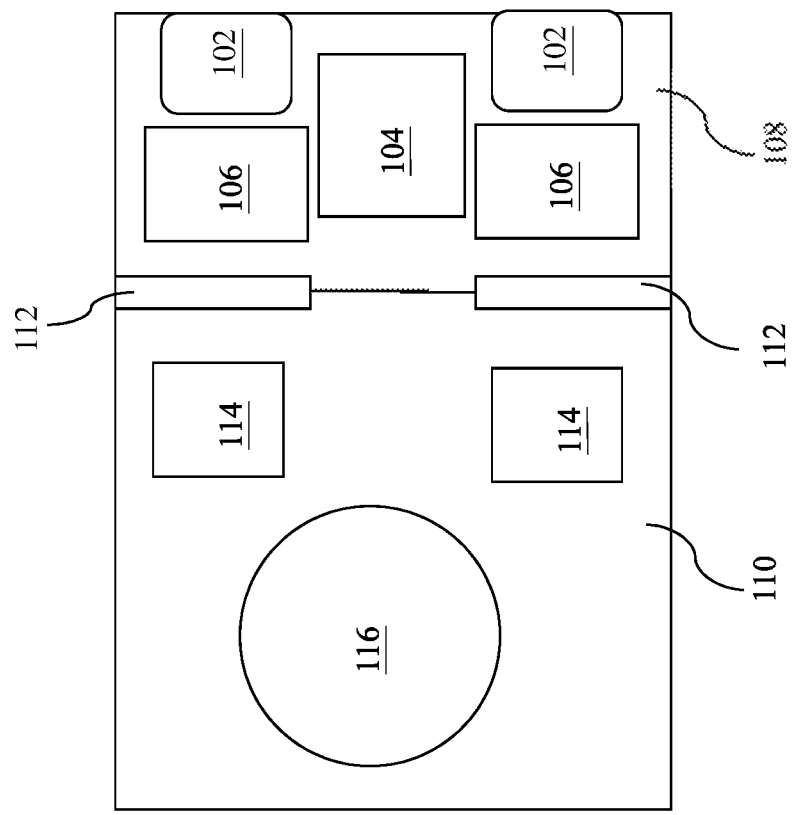
FIG. 5 is a schematic diagram of another embodiment of a processing apparatus integrated with an inner wafer carrier constructed according to aspects of the present disclosure.

FIG. 5 illustrates a schematic top view of a processing apparatus 180 constructed according to aspects of the present disclosure in another embodiment. The method 150 may be implemented in the processing apparatus 180 according to one embodiment. The processing apparatus 180 is similar to the processing apparatus 100. For example, the processing apparatus 180 includes the loading area module 110 that further includes an inner transfer unit 114 and a processing module 116. Particularly, the processing apparatus 180 includes an inner wafer carrier buffer 104 designed and configured to hold one or more wafer carriers and to perform a nitrogen purge to the wafer carrier(s) therein. However, in the processing apparatus 180, the buffer module 108 includes two or more load locks 102, two or more outer transfer units 106 properly configured for parallel wafer carrier transferring with reduced loading time according one embodiment. In another embodiment, the two or more doors 112 are incorporated in the processing apparatus 180 with proper configuration so to provide multiple paths for wafer transferring to the processing module 116. For example, one load lock 102 and one outer transfer unit 106 are paired up to transfer wafer carriers into the inner wafer carrier buffer 104. Similarly, another load lock 102 and another outer transfer unit 106 are paired up to transfer wafer carriers into the inner wafer carrier buffer 104. In another example, one door 112 and one inner transfer unit 114 are paired up to transfer wafers from a wafer carrier at the respective door 112 to the processing module 116. Similarly, another door 112 and another inner transfer unit 114 are paired up to transfer wafers from a wafer carrier at the respective door 112 to the processing module 116.

FIG. 6 illustrates a schematic sectional view of a processing apparatus 190 constructed according to aspects of the present disclosure in other embodiments. The processing apparatus 190 is similar to the processing apparatus 100. For example, the processing apparatus 190 includes the buffer module 108 that further includes an outer transfer module 106 and an inner wafer carrier buffer 104. The processing apparatus 190 includes the loading area module 110 that further includes an inner transfer unit 114 and a processing module 116. However, in the processing apparatus 190, the inner wafer carrier buffer 104 may be configured differently but is operable to store one or more wafer carriers and to perform a nitrogen purge to the wafer carrier(s) therein. Various embodiments of the inner wafer carrier buffer 104 are illustrated as dashed rectangles in the same figure for simplicity.

In one embodiment, the inner wafer carrier buffer 104 is configured in a top portion of the processing apparatus 190, such as the 104*a* or 104*c*. In another embodiment, the inner wafer carrier buffer 104 is configured in a bottom portion of the processing apparatus 190, such as 104*b* and 104*d*. In yet another embodiment, the inner wafer carrier buffer 104 is configured in one side of the buffer module 108 (such as the 104*a* or 104*b*) or another side of the buffer module 108 (such as the 104*a* or 104*b*).

The method 150 of FIG. 3 is applicable to the processing apparatus 190 in various embodiments. The wafer transfer is implemented after the nitrogen purge. Particularly, the operation 158 includes a first step 162 for wafer carrier transferring. At step 162, the outer transfer unit 106 is employed to transfer the wafer carrier 124 to the door 112. The operation 158 includes a second step 164 for wafer transferring after the first step. At step 164, the inner transfer unit 114 is used to transfer wafers from the wafer carrier 124 at the door 112 to the processing module 116 (such as the wafer boat) through the door 112. Afterward, the empty wafer carrier 124 at the door 112 is moved back to the inner wafer carrier buffer 104 by the outer transfer unit 106.

The above described system (or apparatus) and method only serve as examples. The above system and method may be extended and modified and may include proper variations, embodiments, and alternatives without departure of the spirit of the invention. In one embodiment, in the method 150, another nitrogen purge may be implemented to the wafer carrier(s) 124 after the discharge. In another embodiment for the nitrogen purge, another gas purge or gas treatment may be alternatively or additionally applied to the wafer carrier(s) and wafers in the wafer carriers when stored in the inner wafer carrier buffer, such as inert gas purge. In one example, the inert gas purge includes argon purge. In another embodiment, a pressurization device is activated to adjust the pressure of the wafer carrier.

The present disclosure provides a processing apparatus integrated with an inner wafer carrier buffer designed for storing wafer carrier(s) and performing nitrogen purge to the wafer carrier(s). Other variations in this spirit and scope are considered as consistent with the present disclosure and are suggestive. For example, the processing apparatus 100 may be designed otherwise but the inner wafer carrier 104 is designed as a component of the processing apparatus for wafer carrier storage in the processing apparatus and is further designed to apply a nitrogen purge to the wafer carrier(s) in therein.

Thus, the present disclosure provides a semiconductor processing apparatus. The processing apparatus includes a load lock designed to receive a wafer carrier; an inner wafer carrier buffer configured to hold the wafer carrier received from the load lock and to perform a nitrogen purge to the wafer carrier; and a processing module designed to perform a semiconductor process to wafers from the wafer carrier.

In one embodiment of the processing apparatus, the inner wafer carrier buffer has a gas inlet and a gas outlet configured to be connectable to corresponding gas ports of the wafer carrier. In other embodiments, the gas inlet is coupled with a nitrogen source and the gas outlet is coupled with a gas exhaust; and the gas inlet and gas outlet each include a valve operable to control gas transportation.

In another embodiment, the inner wafer carrier buffer further includes a pressurization device configured to be connectable to the wafer carrier and designed to control pressure of the wafer carrier. In yet another embodiment, the pressurization device includes a pressure port for conducting gas; a pressure sensor to monitor the pressure of the wafer carrier; and a valve integrated in the pressure port and coupled with the pressure sensor.

In yet another embodiment, the wafer carrier is a front opening unified pod (FOUP). In yet another embodiment, the processing module includes a furnace designed for thermal oxidation.

In yet another embodiment, the processing apparatus further includes a transfer module designed to transfer the wafers from the inner wafer carrier buffer to the processing module. In yet another embodiment, the processing module includes a door configured between the outer transfer unit and the inner transfer unit. In yet another embodiment, the transfer module further includes an outer transfer unit for transferring the wafer carrier from the inner wafer carrier buffer to the door; and an inner transfer unit for transferring wafers in the wafer carrier at the door to the processing module.

The present disclosure also provides another embodiment of a semiconductor processing apparatus that includes a load lock designed to receive a wafer carrier; an inner wafer carrier buffer configured to hold the wafer carrier from the load lock, wherein the inner wafer carrier buffer has a gas inlet and a gas outlet configured to be connectable to corresponding gas ports of the wafer carrier for gas purge; a processing module designed to perform a semiconductor process to at least one wafer from the wafer carrier; and a transfer module configured to transfer the wafer from the wafer carrier in the inner wafer carrier buffer to the processing module.

In one embodiment of the processing apparatus, the wafer carrier is a front opening unified pod (FOUP); and the processing module includes a furnace designed for thermal oxidation. In another embodiment, the gas inlet is connected to a nitrogen source and the gas outlet is connected to a gas exhaust; and the gas inlet and gas outlet each include a valve operable to control gas transportation.

In yet another embodiment, the inner wafer carrier buffer further includes a pressurization device configured to be connectable to the wafer carrier and designed to control pressure of the wafer carrier.

In yet another embodiment, the transfer module further includes an outer transfer unit for transferring the wafer carrier and an inner transfer unit for transferring wafers in the wafer carrier.

The present disclosure also provides one embodiment of a method of a semiconductor process. The method includes receiving a wafer carrier from a load lock; sending the wafer carrier to an inner wafer carrier buffer; performing a nitrogen purge in the inner wafer carrier buffer; thereafter, transferring at least one wafer from the wafer carrier to the processing module; and performing a fabrication process to the at least one wafer in the process module.

In one embodiment of the method, the transferring at least one wafer from the wafer carrier to a processing module includes moving the wafer carrier out from the inner wafer carrier buffer using an outer transfer unit; and moving the at least one wafer from the wafer carrier out to the processing module using an inner transfer unit.

In another embodiment, the sending the wafer carrier to the inner wafer carrier buffer includes coupling a gas inlet and a gas outlet of the inner wafer carrier buffer to corresponding ports of the wafer carrier. In yet another embodiment, the performing a nitrogen purge includes turning on the gas inlet to provide a nitrogen gas to the wafer carrier.

In yet another embodiment, the sending the wafer carrier to the inner wafer carrier buffer further includes coupling a pressurization device of the inner wafer carrier buffer to a corresponding port of the wafer carrier.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A method, comprising:
receiving a wafer carrier into a load lock, wherein the wafer carrier includes a semiconductor wafer;
moving the wafer carrier from the load lock to an inner wafer carrier buffer (IWCB) using a first transfer unit, wherein the first transfer unit is disposed outside the IWCB;
performing a nitrogen purge to the wafer carrier in the IWCB;
thereafter, moving the semiconductor wafer from the IWCB to a processing module using the first transfer unit and a second transfer unit different from the first transfer unit, wherein the second transfer unit is disposed outside both the IWCB and the processing module; and
performing a fabrication process to the semiconductor wafer in the processing module.

2. The method of claim 1, further comprising providing an apparatus that includes a first enclosed region and a second enclosed region separated from and disposed adjacent the first enclosed region, wherein the first enclosed region includes the load lock, the IWCB, and the first transfer unit, and wherein the second enclosed region includes the processing module and the second transfer unit, and wherein receiving the wafer carrier includes moving the wafer carrier from outside the apparatus to the load lock.

3. The method of claim 1, wherein moving the semiconductor wafer from the IWCB to the processing module includes:
moving the wafer carrier from the IWCB to a door disposed between the IWCB and the processing module using the first transfer unit; and
moving the semiconductor wafer out of the wafer carrier to the processing module through the door using the second transfer unit.

4. The method of claim 1, wherein moving the wafer carrier from the load lock to the IWCB includes coupling a gas inlet and a gas outlet of the IWCB to corresponding ports of the wafer carrier.

5. The method of claim 1, wherein moving the wafer carrier from the load lock to the IWCB includes coupling a pressurization device of the IWCB to a corresponding port of the wafer carrier.

6. The method of claim 5, wherein performing the nitrogen purge includes controlling pressure of the wafer carrier in the IWCB.

7. The method of claim 1, wherein performing the fabrication process includes applying a thermal oxidation process to the semiconductor wafer.

8. A method, comprising:
loading a wafer carrier that includes a semiconductor wafer into a load lock from outside an apparatus, wherein the apparatus includes the load lock, an inner wafer carrier buffer (IWCB) configured to hold the wafer carrier, an outer transfer unit, an inner transfer unit, and a processing module configured to treat the semiconductor wafer;
transferring the wafer carrier from the load lock to the IWCB using the outer transfer unit;
performing a first treatment to the wafer carrier in the IWCB;
thereafter, transferring the semiconductor wafer from the IWCB to the processing module using the outer transfer unit and the inner transfer unit; and
performing a second treatment to the semiconductor wafer in the processing module, wherein the second treatment is different from the first treatment.

9. The method of claim 8, wherein transferring the wafer carrier from the load lock to the IWCB includes coupling a gas inlet, a gas outlet, and a pressurization device of the IWCB to corresponding ports of the wafer carrier.

10. The method of claim 9, wherein performing the first treatment includes:
applying nitrogen gas to the IWCB through the gas inlet;
removing the nitrogen gas from the wafer carrier through the gas outlet; and
controlling pressure of the nitrogen gas using the pressurization device.

11. The method of claim 8, wherein transferring the semiconductor wafer from the IWCB to the processing module includes:
transferring the wafer carrier from the IWCB to a door disposed between the IWCB and the processing module using the outer transfer unit, wherein the outer transfer unit is separated from the load lock, the IWCB, and the processing module; and
thereafter, transferring the semiconductor wafer from the wafer carrier to the processing module through the door using the inner transfer unit, wherein the inner transfer unit is disposed between the door and the processing module.

12. The method of claim 8, wherein transferring the wafer carrier from the load lock to the IWCB includes moving the wafer carrier from the load lock to the IWCB using the outer transfer unit.

13. The method of claim 8, wherein performing the second treatment includes applying a thermal oxidation process, a thermal annealing process, or a combination thereof.

14. The method of claim 8, wherein loading the wafer carrier includes receiving together multiple semiconductor wafers stored in the wafer carrier, and wherein transferring the semiconductor wafer from the IWCB to the processing module includes transferring each of the multiple semiconductor wafers one at a time.

15. A method, comprising:
providing an apparatus for processing semiconductor wafers, wherein the apparatus includes:
a load lock configured to receive a wafer carrier from outside the apparatus, wherein the wafer carrier includes a plurality of semiconductor wafers;
an inner wafer carrier buffer (IWCB) configured to hold the wafer carrier and to perform a gas treatment to the wafer carrier;
a processing module configured to perform a thermal treatment to the semiconductor wafers;
a first transfer unit configured to transfer the wafer carrier from the load lock to the IWCB and from the IWCB to a door disposed between the IWCB and the processing module; and
a second transfer unit configured to transfer semiconductor wafers from the wafer carrier to the processing module through the door;
loading the wafer carrier into the load lock;
sending the wafer carrier from the load lock to the IWCB;
performing the gas treatment to the wafer carrier in the IWCB, thereby treating the semiconductor wafers in the wafer carrier;
moving the treated semiconductor wafers from the IWCB to the processing module; and performing the thermal treatment to the treated semiconductor wafers in the processing module.

16. The method of claim 15, wherein sending the wafer carrier from the load lock to the IWCB includes transferring the wafer carrier from the load lock to the IWCB through an opening of the IWCB and connecting a gas inlet and a gas outlet of the IWCB to corresponding ports of the wafer carrier.

17. The method of claim 15, wherein performing the gas treatment includes purging the wafer carrier with nitrogen.

18. The method of claim 15, wherein performing the gas treatment to the wafer carrier includes adjusting gas pressure in the IWCB via a pressurization device.

19. The method of claim 15, wherein performing the thermal treatment includes performing a thermal oxidation process.

20. The method of claim 15, wherein moving the treated semiconductor wafers includes moving each of the treated semiconductor wafers one at a time into the processing module, and wherein performing the thermal treatment includes performing the thermal treatment to the treated semiconductor wafers simultaneously.

* * * * *